(12) United States Patent
Zhao

(10) Patent No.: US 10,985,034 B2
(45) Date of Patent: Apr. 20, 2021

(54) SEMICONDUCTOR PROCESSING DEVICE

(71) Applicant: BEIJING NAURA MICROELECTRONICS EQUIPMENT CO., LTD, Beijing (CN)

(72) Inventor: Longchao Zhao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 360 days.

(21) Appl. No.: 16/004,655

(22) Filed: Jun. 11, 2018

(65) Prior Publication Data
US 2018/0294170 A1 Oct. 11, 2018

Related U.S. Application Data

(63) Continuation of application No. PCT/CN2016/086205, filed on Jun. 17, 2016.

(30) Foreign Application Priority Data

Dec. 11, 2015 (CN) .......................... 201510918370.8

(51) Int. Cl.
*H01L 21/67* (2006.01)
*C23C 16/44* (2006.01)
(Continued)

(52) U.S. Cl.
CPC .... *H01L 21/67017* (2013.01); *C23C 16/4409* (2013.01); *C23C 16/4412* (2013.01);
(Continued)

(58) Field of Classification Search
CPC ........... H01L 21/67017; H01L 21/6719; H01L 21/677; H01L 21/67011; C23C 16/4412;
(Continued)

(56) References Cited

U.S. PATENT DOCUMENTS 4,838,201 A 6/1989 Fraas et al.
4,980,204 A * 12/1990 Fujii ..................... C23C 16/455
117/98

(Continued)

FOREIGN PATENT DOCUMENTS

CN 104233229 A 12/2014
CN 104674191 A 6/2015
(Continued)

OTHER PUBLICATIONS

Derwent Translation of CN 205552852 U Sep. 7, 2016 (Year: 2016).*

(Continued)

*Primary Examiner* — Jeffrie R Lund
(74) *Attorney, Agent, or Firm* — Anova Law Group, PLLC

(57) ABSTRACT

A semiconductor processing device is provided. The device includes a reaction chamber, a first gas inlet mechanism, and a second gas inlet mechanism that includes a gas inlet, a uniform-flow chamber, at least one gas outlet, and at least one switch element. The gas inlet communicates with the uniform-flow chamber and arranged to deliver a process gas into the uniform-flow chamber. The at least one gas outlet is between the reaction chamber and the uniflow-flow chamber. The at least one switch element is disposed in each gas outlet and arranged to enable the uniform-flow chamber to communicate with the reaction chamber when the process gas is being delivered into the uniform-flow chamber through the gas inlet, and to isolate the uniform-flow chamber from the reaction chamber when no process gas is being delivered into the uniform-flow chamber.

18 Claims, 4 Drawing Sheets

(51) Int. Cl.
*C23C 16/455* (2006.01)
*H01L 21/677* (2006.01)
*H01J 37/32* (2006.01)

(52) U.S. Cl.
CPC .... *C23C 16/4558* (2013.01); *C23C 16/45502* (2013.01); *H01J 37/32449* (2013.01); *H01L 21/677* (2013.01); *H01L 21/67011* (2013.01); *H01L 21/6719* (2013.01)

(58) Field of Classification Search
CPC .......... C23C 16/4409; C23C 16/45502; C23C 16/4558; H01J 37/32449
See application file for complete search history.

(56) References Cited

U.S. PATENT DOCUMENTS

| | | | | |
|---|---|---|---|---|
| 5,496,408 A * | 3/1996 | Motoda | ............... | C23C 16/4481 118/715 |
| 5,683,517 A * | 11/1997 | Shan | ............... | C23C 16/455 118/723 E |
| 5,772,771 A * | 6/1998 | Li | ............... | C23C 16/4405 118/715 |
| 5,792,272 A * | 8/1998 | van Os | ............... | C23C 16/4405 118/723 R |
| 5,851,294 A * | 12/1998 | Young | ............... | C23C 16/45508 118/715 |
| 5,853,484 A * | 12/1998 | Jeong | ............... | C23C 16/45565 118/715 |
| 6,178,918 B1 * | 1/2001 | van Os | ............... | C23C 16/4405 118/723 R |
| 6,833,052 B2 * | 12/2004 | Li | ............... | C23C 16/401 156/345.48 |
| 8,889,023 B2 * | 11/2014 | Matsumoto | ............... | H01J 37/32192 216/69 |
| 8,906,249 B2 * | 12/2014 | Hiroshima | ............... | C23C 16/4558 216/68 |
| 9,840,778 B2 * | 12/2017 | Su | ............... | H01J 37/3244 |
| 10,787,742 B2 * | 9/2020 | Su | ............... | C23C 16/45565 |
| 2001/0000759 A1 | 5/2001 | Doley et al. | | |
| 2002/0146512 A1 * | 10/2002 | Rossman | ............... | H01L 21/02274 427/255.28 |
| 2004/0099378 A1 * | 5/2004 | Kim | ............... | C23C 16/4558 156/345.33 |
| 2006/0130756 A1 * | 6/2006 | Liang | ............... | H01J 37/3244 118/715 |
| 2007/0087296 A1 * | 4/2007 | Kim | ............... | C23C 16/4558 431/181 |
| 2008/0121179 A1 * | 5/2008 | Park | ............... | H01J 37/32449 118/723 R |
| 2013/0319484 A1 * | 12/2013 | Choi | ............... | H01L 21/67034 134/109 |
| 2013/0319612 A1 * | 12/2013 | Su | ............... | C23C 16/52 156/345.24 |
| 2014/0262034 A1 * | 9/2014 | Ishibashi | ............... | H01J 37/321 156/345.29 |
| 2015/0118416 A1 * | 4/2015 | Jang | ............... | C23C 16/45519 427/575 |
| 2015/0371831 A1 * | 12/2015 | Rozenzon | ............... | C23C 16/45578 239/548 |
| 2017/0200586 A1 * | 7/2017 | Treadwell | ............... | C23C 16/4558 |
| 2018/0277398 A1 * | 9/2018 | Osada | ............... | H01L 21/67248 |
| 2018/0277399 A1 * | 9/2018 | Hashimoto | ............... | H01L 21/67017 |
| 2018/0294170 A1 * | 10/2018 | Zhao | ............... | C23C 16/45502 |

FOREIGN PATENT DOCUMENTS

| | | |
|---|---|---|
| CN | 104752274 A | 7/2015 |
| TW | M268461 U | 6/2005 |
| TW | M282145 U | 12/2005 |
| TW | 200628127 A | 8/2006 |
| TW | 201520362 A | 6/2015 |

OTHER PUBLICATIONS

The World Intellectual Property Organization (WIPO) International Search Report for PCT/CN2016/086205 dated Sep. 19, 2016 6 Pages.

* cited by examiner

SEMICONDUCTOR PROCESSING DEVICE

CROSS-REFERENCE TO RELATED APPLICATIONS

This application is a continuation application of International Application No. PCT/CN2016/086205, filed on Jun. 17, 2016, which claims priority to Chinese Patent Application No. 201510918370.8, filed on Dec. 11, 2015. The above enumerated patent applications are incorporated herein by reference.

TECHNICAL FIELD

The present disclosure relates to the field of semiconductor fabrication, and more particularly to a semiconductor processing device.

BACKGROUND

Plasma processing devices are widely used in fabrication processes of integrated circuits (IC) or MEMS devices. A plasma processing device utilizes a large number of active particles such as electrons, ions, excited atoms, etc., to react physically and chemically with a surface of a substrate, so as to change performance of the surface of the substrate. In a fabrication process of an integrated circuit, a gas inlet mechanism is generally responsible for providing a corresponding working gas for plasma generation.

FIG. 1 is a schematic diagram of a conventional plasma processing device. Referring to FIG. 1, the plasma processing device includes a reaction chamber 100 and a gas inlet device, and a chuck 101 disposed within the reaction chamber 100 for carrying a substrate. The gas inlet device includes a central nozzle 102 disposed at a center of a top of the reaction chamber 100, an edge gas inlet mechanism including a gas inlet 106, a chamber 105 and a plurality of gas outlets 107. The chamber 105 is formed by two cover plates 103, 104 arranged around a top of a side wall of the reaction chamber 100, and the two cover plates 103, 104 are assembled with each other to form the chamber 105. The gas inlet 106 is arranged to deliver a process gas into the chamber 105. The plurality of gas outlets 107 are distributed along a circumferential direction of the chamber 105 to deliver the process gas in the chamber 105 into the reaction chamber 100.

The above plasma processing device may be applied to a process in which two different process gases are required to be alternately introduced into the reaction chamber, such as a BOSCH process in which a deposition gas and an etching gas need to be alternately introduced into the reaction chamber. Specifically, in an alternate manner, a first process gas is delivered into the reaction chamber 100 through the central nozzle 102, and a second process gas is delivered into the reaction chamber 100 sequentially through the gas inlet 106, the chamber 105, and the gas outlets 107.

However, as for the edge gas inlet mechanism, after the delivery of the second process gas, part of the process gas may remain inside the chamber 105, and when the edge gas inlet mechanism is not in use, the second process gas remaining inside the chamber 105 may enter the reaction chamber 100 and mix with the first process gas because the chamber 105 is always in communication with the reaction chamber 100 through the gas outlets 107, which results in changes in gas composition within the reaction chamber 100, thereby affecting process uniformity.

SUMMARY

The present disclosure aims to solve at least one of the technical problems existing in the prior art and provides a semiconductor processing device that can avoid the process gas remaining inside the uniform-flow chamber from entering the reaction chamber when alternately introducing two different process gases into the reaction chamber, so that process uniformity can be ensured.

To achieve the objective, one aspect of the present disclosure provides a semiconductor processing device that may include a reaction chamber, a first gas inlet mechanism, and a second gas inlet mechanism. The first gas inlet mechanism may be disposed at a central position of the top of the reaction chamber. The second gas inlet mechanism may include a gas inlet, a uniform-flow chamber, at least one gas outlet, and at least one switch element. The uniform-flow chamber may be circumferentially disposed at an edge position of the top of the reaction chamber in a circumferential direction of the reaction chamber. The gas inlet may communicate with the uniform-flow chamber and arranged to deliver a process gas into the uniform-flow chamber. The at least one gas outlet may be disposed between the reaction chamber and the uniform-flow chamber. The at least one switch element may be disposed in each of the at least one gas outlet and arranged to enable the uniform-flow chamber to communicate with the reaction chamber when the process gas is being delivered into the uniform-flow chamber through the gas inlet, and to isolate the uniform-flow chamber from the reaction chamber when no process gas is being delivered into the uniform-flow chamber.

A semiconductor processing device according to other embodiments may also be provided. The device may include a reaction chamber, a first gas inlet mechanism, and a second gas inlet mechanism that may include a gas inlet, a uniform-flow chamber, and a switch element. The first gas inlet mechanism may be arranged to deliver a first process gas into the reaction chamber, and the second gas inlet mechanism may be arranged to deliver a second process gas from the gas inlet into the reaction chamber through the uniform-flow chamber. The switch element disposed between the uniform-flow chamber and the reaction chamber may include a movable member. When the second process gas is being delivered into the uniform-flow chamber from the gas inlet, a gas pressure applied by the second process gas may cause the movable member to move and turn the switch element on to communication the uniform-flow chamber with the reaction chamber so as to bring the second process gas into the reaction chamber. When no second process gas is being delivered into the uniform-flow chamber, the movable member of the switch element may remain at an original position to isolate the uniform-flow chamber from the reaction chamber.

In the semiconductor processing device provided by the present disclosure, a first gas inlet mechanism and a second gas inlet mechanism may be provided at a central position and an edge position of the top of the reaction chamber, respectively. The first gas inlet mechanism and the second gas inlet mechanism may be connected to different process gas sources and deliver process gases into the reaction chamber alternately. At least one switch element may be provided in each gas outlet of the second gas inlet mechanism. With the switch element, when a process gas is being delivered into the uniform-flow chamber, the uniform-flow chamber may communicate with the reaction chamber under the pressure of the internal environment of the uniform-flow chamber of the second gas inlet mechanism. When no process gas is being delivered into the uniform-flow chamber, the uniform-flow chamber is isolated from the reaction chamber under the pressure of the internal environment of the uniform-flow chamber of the second gas inlet mechanism. In this way, when a gas is delivered into the reaction chamber through the first gas inlet mechanism, the process gas remaining in the uniform-flow chamber is prevented from entering the reaction chamber, thereby ensuring uniformity of the process and the product yield.

BRIEF DESCRIPTION OF DRAWINGS

The following drawings are merely examples for illustrative purposes according to various disclosed embodiments and are not intended to limit the scope of the present disclosure.

DETAILED DESCRIPTION

In order to make those skilled in the art better understand the technical solutions of the present disclosure, embodiments of a semiconductor processing device provided in the present disclosure will be described in detail below with reference to the accompanying drawings. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Figure 1:
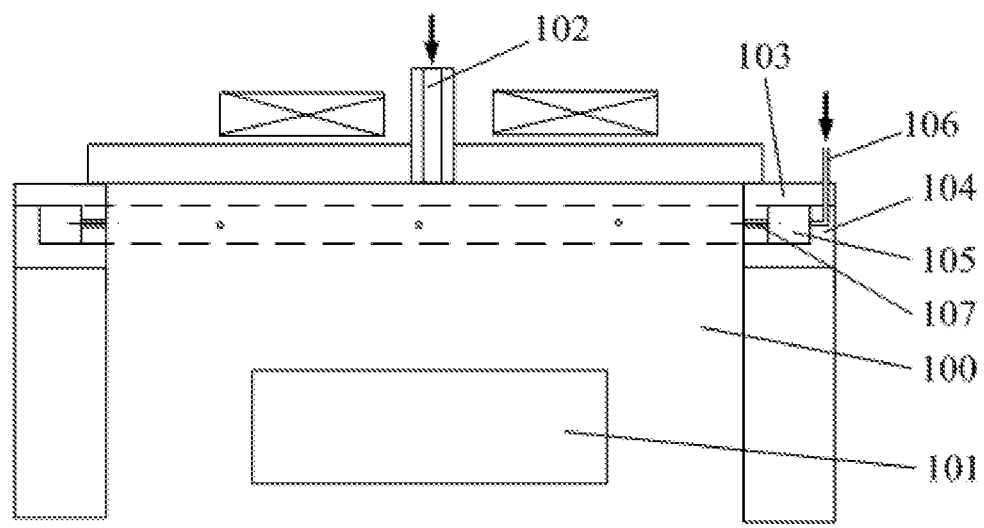
FIG. 1 is a schematic structural diagram of an existing plasma processing device.
Figure 2A:
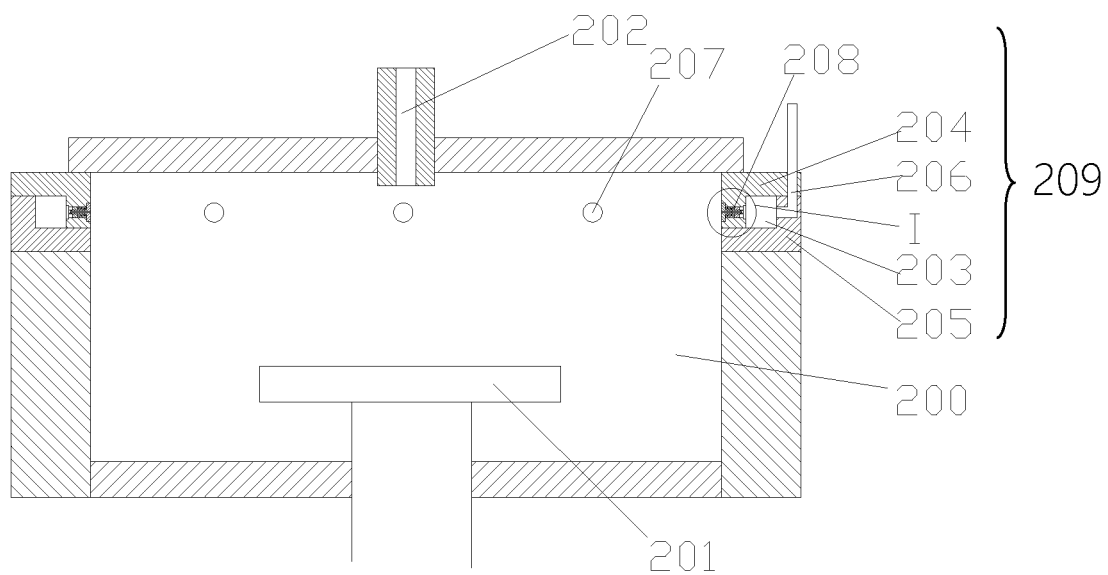
FIG. 2A is a cross-sectional view of a semiconductor processing device according to a first embodiment of the present disclosure.

FIG. 2A is a cross-sectional view of a semiconductor processing device according to a first embodiment of the present disclosure. Referring to FIG. 2A, in some embodiments, the semiconductor processing device may include a reaction chamber 200, a first gas inlet mechanism 202, and a second gas inlet mechanism 209, and a substrate carrier 201 for carrying a workpiece to be processed that may be disposed in the reaction chamber 200. The first gas inlet mechanism 202 may be disposed at a central position of the top of the reaction chamber 200. The second gas inlet mechanism 209 may be disposed at an edge position of the top of the reaction chamber 200.

The semiconductor processing device provided in the embodiment of the present disclosure may be applied to a process in which two different process gases are alternately introduced into the reaction chamber 200. For example, delivery of a first process gas into the reaction chamber 200 through the first gas inlet mechanism 202 and delivery of a second process gas into the reaction chamber 200 through the second gas inlet mechanism 209 may be alternated.

The second gas inlet mechanism 209 in embodiments of the present embodiment will be described in detail as follows.

As shown in FIG. 2A, in some embodiments, the second gas inlet mechanism 209 may include a gas inlet 206, a uniform-flow chamber 203, and a plurality of gas outlets 207. The uniform-flow chamber 203 may be formed by assembling two cover plates 204, 205 circumferentially arranged at a top of a side wall of the reaction chamber 200. In some embodiments, in a half-sectional view along an axial direction of the reaction chamber 200, each of the two cover plates 204, 205 may be L-shaped, and the two cover plates 204, 205 may be lap-jointed and assembled to form the uniform-flow chamber 203.

The gas inlet 206 communicates with the uniform-flow chamber 203 and penetrate through the cover plate 204 to deliver a process gas into the uniform-flow chamber 203 from an external of the reaction chamber 200.

In some embodiments, the plurality of gas outlets 207 may be evenly distributed along a circumferential direction of the uniform-flow chamber 203, and each of the plurality of gas outlets 207 may penetrate through the cover plate 204 in a radial direction of the uniform-flow chamber 203 to deliver the process gas in the uniform-flow chamber 203 into the reaction chamber 200. In some embodiments, a switch element 208 may be disposed in each gas outlet 207 and arranged to enable the uniform-flow chamber 203 and the reaction chamber 200 to communicate with each other under the action of gas pressure in the uniform-flow chamber 203 when a process gas is being delivered into the uniform-flow chamber 203 through the gas inlet 206 and arranged to isolate the uniform-flow chamber 203 from the reaction chamber 200 under the action of the gas pressure in the uniform-flow chamber 203 when no process gas is being delivered into the uniform-flow chamber 203. In this way, when a process gas is delivered to the reaction chamber 200 through the first gas inlet mechanism 202, the second process gas remaining in uniform-flow chamber 203 can be prevented from entering into the reaction chamber 200 to mix with the first process gas, thereby ensuring uniformity of the process and the product yield.

Figure 2B:
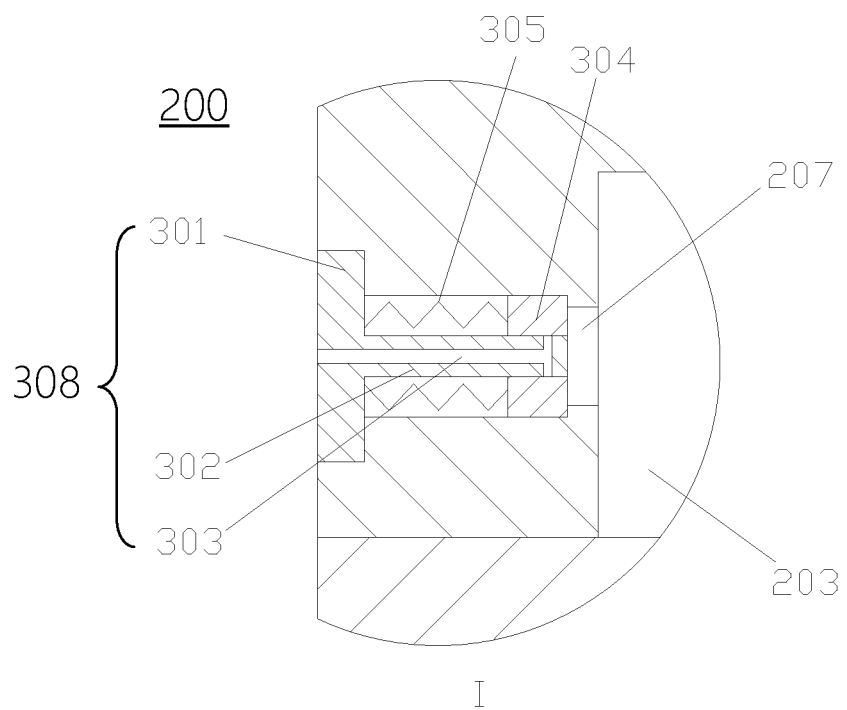
FIG. 2B is an enlarged view of an area I in FIG. 2A when no gas is being introduced from a uniform-flow chamber.
Figure 2C:
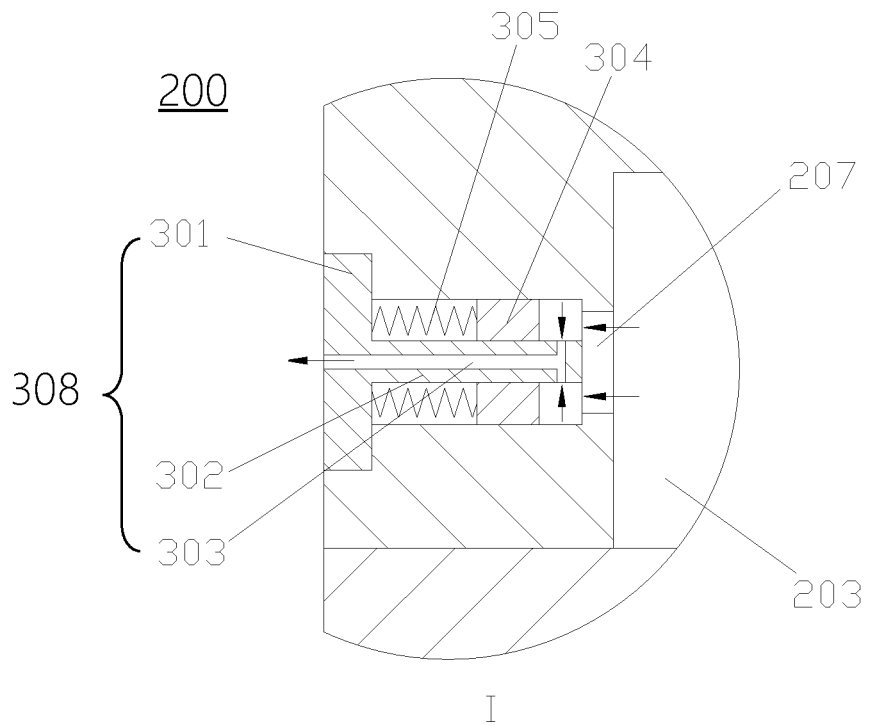
FIG. 2C is an enlarged view of the area I in FIG. 2A when a gas is being introduced.

Please refer to FIGS. 2B and 2C. FIG. 2B is an enlarged view of an area I in FIG. 2A when no gas is being introduced from the uniform-flow chamber 203; and FIG. 2C is an enlarged view of the area I in FIG. 2A when a gas is being introduced. As shown in FIGS. 2B and 2C, in some embodiments, the switch element 208 may include a fixing member 308, a movable member 304, and an elastic member 305. For example, the elastic member 305 may include a compression spring. The fixing member 308 and the movable member 304 may block off the gas outlet 207 in a normal state. The fixing member 308 and the movable member 304 may be disposed opposite to each other in an axial direction of the gas outlet 207. As shown in FIGS. 2A and 2B, the movable member 304 may be arranged close to an inlet end of the gas outlet 207, and the fixing member 308 may be arranged close to an outlet end of the gas outlet 207. In some embodiments, the fixing member 308 may include an end portion 301 and a shaft portion 302. The end portion 301 may be disposed at an outlet end of the gas outlet 207 (a left end of the gas outlet 207 as shown in, e.g., FIG. 2B). The shaft portion 302 may be in a columnar shape and include one end (a left end of the shaft portion 302 as shown in, e.g., FIG. 2B) connected with the end portion 301 and located at a central position of the end portion 301. Another end of the shaft portion 302 may extend horizontally towards the inlet end of the gas outlet 207 (a right end of the gas outlet 207 as shown in FIG. 2B).

The fixing member 308 may include a first channel 303. An outlet end of the first channel 303 (a left end of the first channel 303 as shown in FIG. 2B) may be arranged on an inner side wall of the end portion 301 facing the reaction chamber 200, and the inner side wall may be exposed to an internal environment of the reaction chamber 200 to communicate with the reaction chamber 200. An inlet end of the first channel 303 (a right end of the first channel 303 as shown in FIG. 2B) may be on an outer peripheral wall of the shaft portion 302. The inlet end of the first channel 303 may include a plurality of entrances symmetrically distributed along a circumferential direction of the shaft portion 302 to improve gas-intake efficiency.

The movable member 304 may be ring-shaped and sleeved on the shaft portion 302, and an inner peripheral wall of the movable member 304 may be fitted to the outer peripheral wall of the shaft portion 302 in a sliding manner. The elastic member 305 may be sleeved on the shaft portion 302 and located between the end portion 301 and an end surface of the movable member 304 (a left end surface of the movable member 304 as shown in FIG. 2B). As such, an elastic connection between the movable member 304 and the fixing member 308 is achieved through the elastic member 305, and a position of the movable member 304 relative to the fixing member 308 changes due to elastic deformation of the elastic member 305. As shown in FIG. 2B, in a case where no process gas is being delivered into the uniform-flow chamber 203, a gas pressure in the uniform-flow chamber 203 is low, pressure applied on the movable member 304 by the gas pressure is too small to significantly deform the elastic member 305, and therefore, the elastic member 305 is substantially in its original state (i.e., the elastic member 305 substantially maintains its length in a free state). At this time, in the normal state, the movable member 304 is at a position where the movable member 304 seals off every inlet end of the first channel 303. In this way, when the first gas inlet mechanism 202 delivers a process gas into the reaction chamber 200, the process gas remaining in the uniform-flow chamber 203 can be prevented from entering into the reaction chamber 200, thereby ensuring the uniformity of the process and the product yield.

In a case where a process gas is being delivered into the uniform-flow chamber 203 through the gas inlet 206, as shown in FIG. 2C, the gas pressure in uniform-flow chamber 203 may gradually rise, and when the gas pressure rises to such an extent that the pressure applied to the movable member 304 is greater than an elastic force of the elastic member 305, the movable member 304 may start to elastically deform the elastic member 305 (for example, compressing a compression spring as the elastic member 305), that is, the movable member 304 may slide with the deformation of the elastic member 305, until each inlet end of the first channel 303 communicates with the uniform-flow chamber 203. In this case, the process gas in the uniform-flow chamber 203 may enter the first channel 303 through each inlet end of the first channel 303, and then may enter the reaction chamber 200 through the outlet end of the first channel 303. A flowing direction of the process gas is shown by arrows in FIG. 2C. When delivery of the process gas into the uniform-flow chamber 203 is stopped, the gas pressure in the uniform-flow chamber 203 may drop, so that the movable member 304 may slide back (i.e., returns back to the position as shown in FIG. 2B) under the action of the elastic force of the elastic member 305, so as to isolate each inlet end of the first channel 303 from the uniform-flow chamber 203 again.

It should be noted that, in some embodiments, the inlet end of the first channel 303 may include a plurality of entrances evenly distributed along the circumferential direction of the shaft portion 302. However, the present disclosure is not limited thereto. In practical applications, it may be unnecessary to evenly distribute the plurality of entrances along the circumferential direction of the shaft portion 302. In other embodiments, the first channel 303 may include only one inlet end.

Figure 3A:
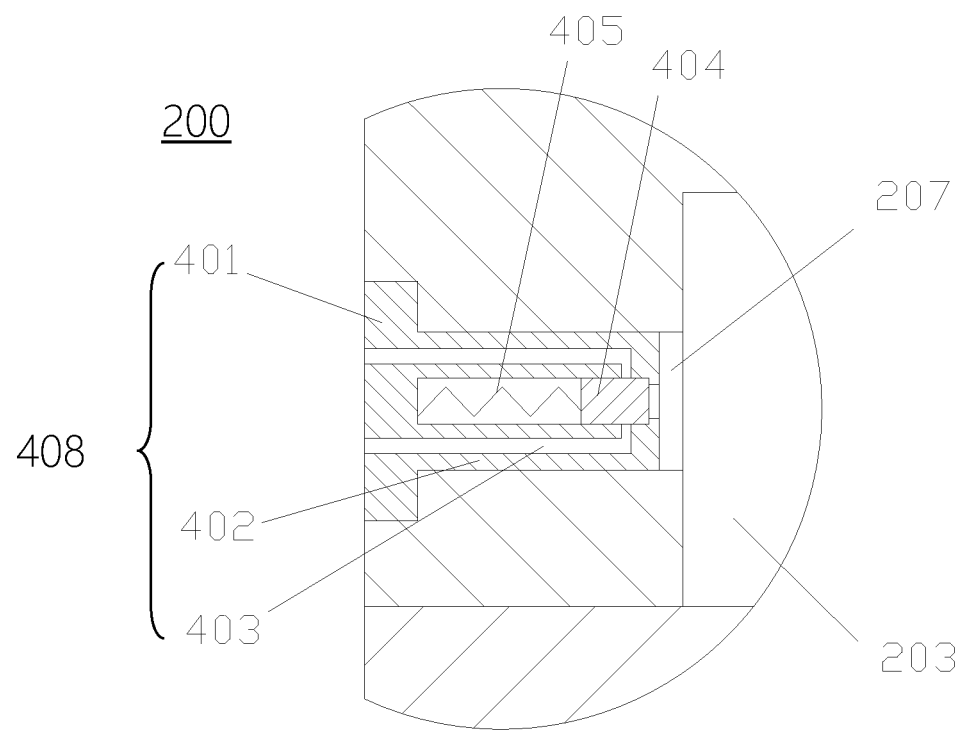
FIG. 3A is an enlarged view of a switch element according to a second embodiment of the present disclosure when no gas is being introduced from a uniform-flow chamber.
Figure 3B:
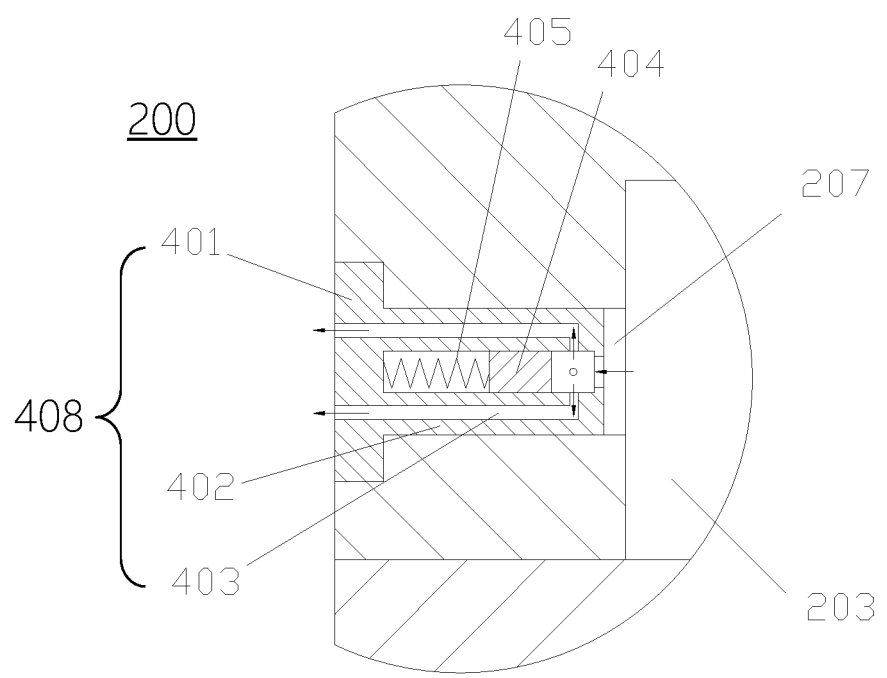
FIG. 3B is an enlarged view of the switch element according to the second embodiment of the present disclosure when a gas is being introduced.

Please refer to FIGS. 3A and 3B. FIG. 3A is an enlarged view of a switch element according to a second embodiment of the present disclosure when no gas is being introduced from the uniform-flow chamber 203, and FIG. 3B is an enlarged view of the switch element according to the second embodiment of the present disclosure when a gas is being introduced. As shown in FIGS. 3A and 3B, as compared to the first embodiment, the semiconductor processing device provided in this embodiment may also include a reaction chamber, a first gas inlet mechanism, and a second gas inlet mechanism, and a switch element that may be disposed in each gas outlet and correspond to each of the gas outlet. Since structures and functions of the foregoing mechanisms and element have been described in detail with respect to the first embodiment, they will not be described repeatedly herein. In the following, only differences between the second embodiment and the first embodiment will be described in detail.

The switch element according to this embodiment may include a fixing member 408, a movable member 404 and an elastic member 405. For example, the elastic member 405 may include a compression spring. The fixing member 408 and the movable member 404 may block off the gas outlet 207 in a normal state and may be arranged opposite to each other in an axial direction of the gas outlet 207, and the movable member 404 may be arranged at an outer side of the fixing member 408. Further, the fixing member 408 may include an end portion 401 and a shaft portion 402. The end portion 401 may be disposed at an outlet end of the gas outlet 207. The shaft portion 402 may be in a ring shape, an outer peripheral wall of the shaft portion 402 may be fitted to an inner wall of the gas outlet 207. The shaft portion 402 may include one end connected to the end portion 401, and another end of the shaft portion 402 may extend horizontally towards the inlet end of the gas outlet 207 in view of an orientation of FIG. 3A.

Moreover, the first channel 403 of the fixing member 408 may include one or more paths. In a case where the first channel 403 of the fixing member 408 has a plurality of paths, the plurality of paths may be symmetrically distributed along a circumferential direction of the shaft portion 402, so that gas-intake efficiency and gas-intake uniformity can be improved. An outlet end of each first channel 403 may be arranged on an inner side wall of the end portion 401 facing the reaction chamber 200, and the inner side wall may be exposed to an internal environment of the reaction chamber 200. An outlet end of each first channel 403 communicates with the reaction chamber 200. An inlet end of each first channel 403 may be arranged on an inner peripheral wall of the shaft portion 402.

The movable member 404 may include a columnar shape and may be arranged within the shaft portion 402, and an outer peripheral wall of the movable member 404 may be fitted to an inner peripheral wall of the shaft portion 402 in a sliding manner. The elastic member 405 may be located within the shaft portion 402 and between the end portion 401 and an end surface of the movable member 404, so that an elastic connection between the movable member 404 and the fixing member 408 is achieved through the elastic member 405. The position of the movable member 404 relative to the fixing member 408 may change due to elastic deformation of the elastic member 405. As shown in FIG. 3A, in a case where no process gas is being delivered into the uniform-flow chamber 203, a gas pressure in the uniform-flow chamber 203 may be low, pressure exerted by the gas pressure to the movable member 404 may be smaller than an elastic force of the elastic member 405, therefore, the elastic member 405 may be substantially in its original state (i.e., the elastic member 405 may substantially maintain its length in a free state). At this time, the movable member 404 may be at a position where the movable member 404 can completely seal off the inlet end of the first channel 403. In this way, when a process gas is delivered to the reaction chamber 200 through the first gas inlet mechanism 202, the process gas remaining in the uniform-flow chamber 203 can be prevented from entering into the reaction chamber 200, thereby ensuring the uniformity of the process and the product yield.

In a case where a process gas is being delivered into the uniform-flow chamber 203 through the gas inlet 206, as shown in FIG. 3B, the gas pressure in the uniform-flow chamber 203 may gradually rise, and when the gas pressure rises to such an extent that the pressure applied to the movable member 404 is greater than the elastic force of the elastic member 405, the movable member 404 may start to elastically deform the elastic member 405. That is, the movable member 404 may slide with the deformation of the elastic member 405, until each inlet end of the first channel 403 communicates with the uniform-flow chamber 203. In this case, the process gas in the uniform-flow chamber 203 may enter the first channel 403 through each inlet end of the first channel 403 and may enter the reaction chamber 200 through the outlet end of the first channel 403. A flowing direction of the process gas is shown by arrows in FIG. 3B. When delivery of the process gas into the uniform-flow chamber 203 is stopped, the gas pressure in the uniform-flow chamber 203 may drop, so that the movable member 404 may slide back (i.e., the movable member 404 may return back to the position as shown in FIG. 3A) under the action of the elastic force of the elastic member 405, so as to isolate each inlet end of the first channel 403 from the uniform-flow chamber 203.

It should be noted that, in some embodiments, the first channel 403 may include a plurality of paths evenly distributed along the circumferential direction of the shaft portion 402. However, the present disclosure is not limited thereto. In practical applications, it may be unnecessary to evenly distribute the plurality of paths of the first channel 403 along the circumferential direction of the shaft portion 402. In other embodiments, there may be only one first channel 403.

Figure 4A:
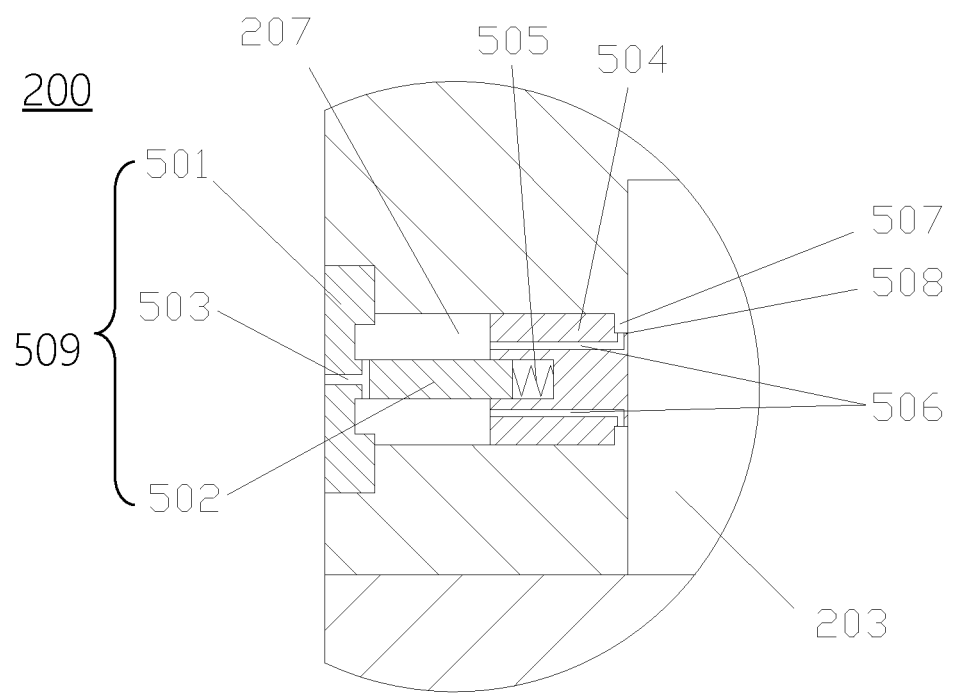
FIG. 4A is an enlarged view of a switch element according to a third embodiment of the present disclosure when no gas is being introduced from a uniform-flow chamber.
Figure 4B:
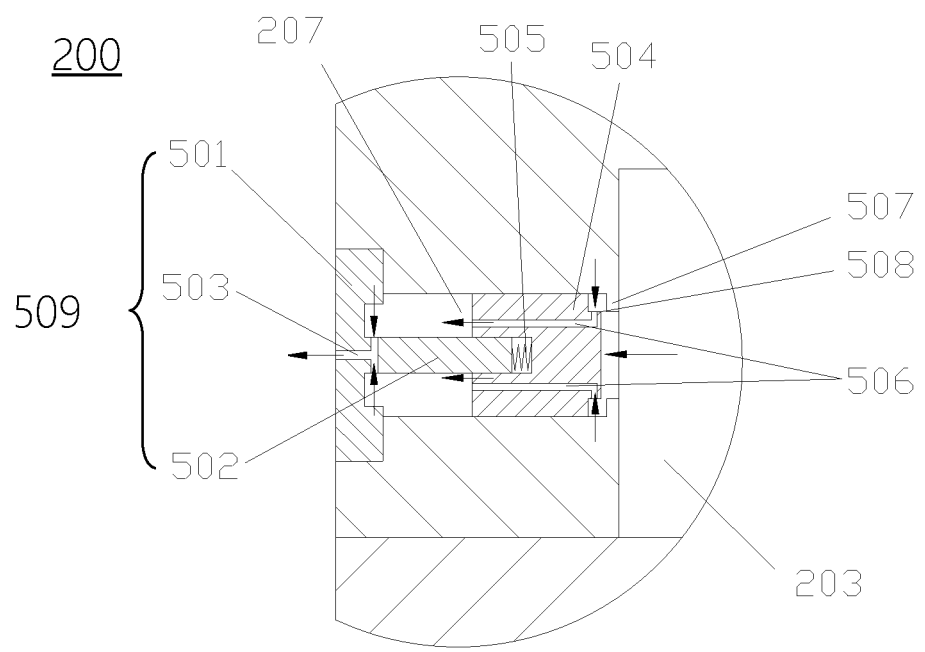
FIG. 4B is an enlarged view of the switch element according to the third embodiment of the present disclosure when a gas is being introduced.

Please refer to FIGS. 4A and 4B. FIG. 4A is an enlarged view of a switch element according to a third embodiment of the present disclosure when no gas is being introduced from the uniform-flow chamber 203, and FIG. 4B is an enlarged view of the switch element according to the third embodiment of the present disclosure when a gas is being introduced. As shown in FIGS. 4A and 4B, as compared to the first embodiment, the semiconductor processing device provided in this embodiment may also include a reaction chamber, a first gas inlet mechanism, and a second gas inlet mechanism, and a switch element is disposed in each gas outlet. Since structures and functions of the foregoing mechanisms and element have been described in detail in the first embodiment, they will not be described repeatedly herein. In the following, only differences between the third embodiment and the first embodiment will be described in detail.

The switch element according to this embodiment may include a fixing member 509, a movable member 504 and an elastic member 505. For example, the elastic member 505 may include a compression spring. The fixing member 509 and the movable member 504 may block off the gas outlet 207 in a normal state and may be arranged opposite to each other in the axial direction of the gas outlet 207. The movable member 504 may be arranged close to the inlet end of the gas outlet 207, and the fixing member 509 may be arranged close to an outlet end of the gas outlet 207. Further, the fixing member 509 may include an end portion 501 and a shaft portion 502. The end portion 501 may be disposed at an outlet end of the gas outlet 207. The shaft portion 502 may be in a columnar shape and arranged horizontally in view of FIG. 4A. The shaft portion 502 may include one end connected with the end portion 501 and may be located at a central position of the end portion 501, and another end extend horizontally towards the inlet end of the gas outlet 207 in view of FIG. 4A.

Moreover, the fixing member 509 may include a first channel 503. An outlet end of the first channel 503 may be arranged on an inner side wall of the end portion 501 facing the reaction chamber 200, and the inner side wall may be exposed to the internal environment of the reaction chamber 200, so that the first channel 503 is in communication with the reaction chamber 200. An inlet end of the first channel 503 may be arranged on an outer peripheral wall of the shaft portion 502, and the inlet end of the first channel 503 may include a plurality of entrances symmetrically distributed along a circumferential direction of the shaft portion 502 to improve gas-intake efficiency and gas-intake uniformity.

A hole matching the shaft portion 502 may be provided on a surface of the movable member 504 opposite to the shaft portion 502. In addition, the second channel 506 of the movable member 504 may include one or more paths located at an outer side of the hole. In a case where the second channel 506 of the movable member 504 has a plurality of paths, the plurality of paths are symmetrically distributed around the hole to improve gas-intake efficiency and gas-intake uniformity. An outlet end of each second channel 506 may be arranged on a surface of the movable member 504 opposite to the end portion 501, so that an inlet end of the first channel 503 is in communication with the outlet end of the second channel 506. Moreover, an outer peripheral wall of the movable member 504 may be fitted to an inner wall of the gas outlet 207 in a sliding manner. A concave part 508 may be formed at an end of the movable member 504 close to the uniform-flow chamber 203, and a convex part 507 corresponding to the concave part 508 may be provided on an inner wall of the gas outlet 207. An inlet end of the second channel 506 may be arranged on a surface of the concave part 508 matching the convex part 507. The elastic member 505 may be located in the hole and extend between an end surface (right end as shown in FIG. 4A) of the shaft portion 502 and a bottom surface of hole. That is, the elastic member 505 may extend in an axial direction of the shaft portion 502, and an elastic connection between the movable member 504 and the fixing member 308 can be realized through the elastic member 505. As shown in FIG. 4A, when no process gas is being delivered into the uniform-flow chamber 203, the gas pressure in the uniform-flow chamber 203 may be low, the pressure exerted by the gas pressure on the movable member 504 may be less than an elastic force of the elastic member 505, the elastic member 505 may be substantially in its original state (i.e., the elastic member 505 may substantially maintain its length in a free state). In the meantime, the convex part 507 may be embedded in the concave part 508, and the convex part 507 and the concave part 508 may cooperate to seal off the inlet end of the second channel 506 to isolate the inlet end of the second channel 506 from the uniform-flow chamber 203. In this way, when a process gas is delivered into the reaction chamber 200 through the first gas inlet mechanism 202, the process gas remaining in the uniform-flow chamber 203 can be prevented from entering into the reaction chamber 200, thereby ensuring uniformity of the process and the product yield.

In a case where a process gas is being delivered into the uniform-flow chamber 203 through the gas inlet 206, as shown in FIG. 4B, the gas pressure in the uniform-flow chamber 203 may gradually rise, and when the gas pressure rises to such an extent that the pressure applied to the movable member 504 is greater than the elastic force of the elastic member 505, the movable member 504 may start to elastically deform the elastic member 505. That is, the movable member 504 may slide, for example leftwards, with the deformation of the compression spring 505, until the concave part 508 and the convex part 507 are separated from each other, i.e., a rightmost end of the movable member 504 is closer to an inner side wall of the end portion 501 than a leftmost end of the convex part 507, so that a gap may be formed between the rightmost end of the movable member 504 and the leftmost end of the convex part 507, thus making the inlet end of the second channel 506 communicate with the uniform-flow chamber 203. In this case, the process gas in the uniform-flow chamber 203 may enter the second channel 506 through the inlet end of the second channel 506, enter a space of the gas outlet 207 between the movable member 504 and the end portion 501 through the outlet end of the second channel 506, then enter the first channel 503 through each inlet end of the first channel 503, and enter the reaction chamber 200 through the outlet end of the first channel 503. A flowing direction of the process gas is shown by arrows in FIG. 4B. When delivery of the process gas into the uniform-flow chamber 203 is stopped, the gas pressure in the uniform-flow chamber 203 may drop, so that the movable member 504 may slide back (i.e., the movable member 504 may return back to the position in FIG. 4A) under the action of the elastic force of the elastic member 505, so as to isolate the inlet end of the second channel 506 from the uniform-flow chamber 203.

It should be noted that although the compression spring is taken as an example as the elastic member, the present disclosure is not limited thereto. An elastic member in other form, such as a bellows or a corrugated pipe, may be used, as long as the elastic member can have elastic deformation which is sufficient to make the uniform-flow chamber and the reaction chamber communicate with each together when a gas is being delivered into the uniform-flow chamber, and have no deformation or have deformation which is insufficient to make the uniform-flow chamber and the reaction chamber communicate with each other when no gas is being delivered into the uniform-flow chamber.

In summary, each of the semiconductor processing devices provided in the above embodiments of the present disclosure has a first gas inlet mechanism, for example arranged at a central position of the top of the reaction chamber," and a second gas inlet mechanism, for example arranged at an edge position of the top of the reaction chamber, the first gas inlet mechanism and the second gas inlet mechanism are connected to different process gas sources and deliver process gases into the reaction chambers alternately, and a switch element is provided in each gas outlet of the second gas inlet mechanism. With the switch element, when a process gas is being delivered into the uniform-flow chamber, the uniform-flow chamber may communicate with the reaction chamber under the pressure of the internal environment of the uniform-flow chamber of the second gas inlet mechanism; when no process gas is being delivered into the uniform-flow chamber, the uniform-flow chamber may be isolated from the reaction chamber under the pressure of the internal environment of the uniform-flow chamber of the second gas inlet mechanism. In this way, when a gas is delivered into the reaction chamber through the first gas inlet mechanism, the process gas remaining in the uniform-flow chamber is prevented from entering the reaction chamber, thereby ensuring uniformity of the process and the product yield.

It could be understood that the above embodiments are merely exemplary embodiments used for illustrating the principle of the present disclosure, but the present disclosure is not limited thereto. For a person of ordinary skill in the art, various variations and improvements may be made without departing from the spirit and essence of the present disclosure, and these variations and improvements are also considered to be within the protection scope of the present disclosure.

What is claimed is:

1. A semiconductor processing device comprising: a reaction chamber and a second gas inlet mechanism that includes a gas inlet, a uniform-flow chamber, at least one gas outlet, and at least one switch element, wherein:
   the uniform-flow chamber is disposed at an edge position of a top of the reaction chamber in a circumferential manner of the reaction chamber;
   the gas inlet communicating with the uniform-flow chamber is arranged to deliver a process gas into the uniform-flow chamber;
   the at least one gas outlet is disposed between the reaction chamber and the uniform-flow chamber; and
   each of the at least one switch element includes an elastic member, a movable member, and a fixing member, and is disposed in each of the at least one gas outlet,
   wherein:
   the elastic member is disposed between the movable member and the fixing member,
   the movable member is arranged at a first position to isolate the uniform-flow chamber from the reaction chamber, and
   in response to the process gas being delivered into the uniform-flow chamber through the gas inlet, the movable member is moved to a second position, by the process gas, with respect to the fixing member to deform the elastic member and enable a communication between the uniform-flow chamber and the reaction chamber, the first position being different from the second position.

2. The semiconductor processing device of claim 1, wherein:
   the fixing member and the movable member are configured to block off the gas outlet in a normal state and are arranged opposite to each other in an axial direction of the gas outlet, the movable member is close to an inlet end of the gas outlet, the fixing member is close to an outlet end of the gas outlet, and the fixing member has a first channel including an outlet end in communication with the reaction chamber; and one end of the movable member is exposed to an internal environment of the uniform-flow chamber, wherein:

when the process gas is being delivered into the uniform-flow chamber through the gas inlet, the movable member is arranged to deform the elastic member under a pressure of the internal environment of the uniform-flow chamber and to move from the first position to the second position, with respect to the fixing member, to enable an inlet end of the first channel to communicate with the uniform-flow chamber, and when no process gas is being delivered into the uniform-flow chamber, the movable member is configured at the first position to isolate the inlet end of the first channel from the uniform-flow chamber.

3. The semiconductor processing device of claim 2, wherein the fixing member comprises an end portion and a shaft portion, wherein:

the end portion is disposed at the outlet end of the gas outlet;

the shaft portion is in a column shape and includes one end connected with the end portion and located at a central position of the end portion, and another end extending towards the inlet end of the gas outlet, the inlet end of the first channel being on an outer peripheral wall of the shaft portion, and the outlet end of the first channel being on an inner side wall of the end portion and facing the reaction chamber;

the movable member is in a ring shape and sleeved on the shaft portion, and an inner peripheral wall of the movable member is fitted to the outer peripheral wall of the shaft portion in a sliding manner; and the elastic member is sleeved on the shaft portion and between the end portion and an end surface of the movable member.

4. The semiconductor processing device of claim 3, wherein the inlet end of the first channel includes a plurality of entrances symmetrically distributed along a circumferential direction of the shaft portion.

5. The semiconductor processing device of claim 2, wherein the fixing member comprises an end portion and a shaft portion, wherein:

the end portion is disposed at the outlet end of the gas outlet;

the shaft portion is in a ring shape, an outer peripheral wall of the shaft portion is fitted to an inner wall of the gas outlet, one end of the shaft portion is connected to the end portion, another end of the shaft portion extends towards the inlet end of the gas outlet, the inlet end of the first channel is on an inner peripheral wall of the shaft portion, and the outlet end of the first channel is on an inner side wall of the end portion facing the reaction chamber;

the movable member is in a column shape and arranged inside the shaft portion, and an outer peripheral wall of the movable member is fitted to the inner peripheral wall of the shaft portion in a sliding manner; and the elastic member is located at an inner side of the shaft portion and between the end portion and an end surface of the movable member.

6. The semiconductor processing device of claim 5, wherein the first channel of the fixing member has a plurality of paths symmetrically distributed along a circumferential direction of the shaft portion.

7. The semiconductor processing device of claim 2, wherein the second gas inlet mechanism comprises a plurality of the gas outlets evenly distributed along a circumferential direction of the uniform-flow chamber.

8. The semiconductor processing device of claim 1, wherein:

the fixing member and the movable member are configured to block off the gas outlet in a normal state and are arranged opposite to each other along an axial direction of the gas outlet, the movable member is close to an inlet end of the gas outlet, the fixing member is close to an outlet end of the gas outlet, the fixing member has a first channel, the movable member has a second channel, an outlet end of the first channel is in communication with the reaction chamber, and an inlet end of the first channel is in communication with an outlet end of the second channel; and one end of the movable member is exposed to an internal environment of the uniform-flow chamber, wherein:

when the process gas is being delivered into the uniform-flow chamber through the gas inlet, the movable member is arranged to deform the elastic member under a pressure of the internal environment of the uniform-flow chamber and to move from the first position to the second position to enable an inlet end of the second channel to communicate with the uniform-flow chamber, and when no process gas is being delivered into the uniform-flow chamber, the movable member is at the first position to isolate the inlet end of the second channel from the uniform-flow chamber.

9. The semiconductor processing device of claim 8, wherein the fixing member comprises an end portion and a shaft portion, wherein:

the end portion is disposed at and blocks off the outlet end of the gas outlet;

the shaft portion is in a column shape, one end of the shaft portion is connected with the end portion and located at a central position of the end portion, and another end of the shaft portion extends towards the inlet end of the gas outlet, the inlet end of the first channel is on an outer peripheral wall of the shaft portion, and the outlet end of the first channel is on an inner side wall of the end portion facing the reaction chamber;

a hole matching the shaft portion is provided on a surface of the movable member facing the shaft portion, the second channel is at an outer side of the hole, and the outlet end of the second channel is on a surface of the movable member facing the end portion;

an outer peripheral wall of the movable member is fitted to an inner wall of the gas outlet in a sliding manner, a concave part and a convex part corresponding to each other are provided on the movable member and the inner wall of the gas outlet, respectively, and the concave part and the convex part are arranged to be fitted with each other when the movable member is at the first position and separated from each other when the movable member deforms the elastic member; and the inlet end of the second channel is on a surface of the concave part matching the convex part; and the elastic member is located in the hole and between an end surface of the shaft portion and a bottom surface of the hole.

10. The semiconductor processing device of claim 9, wherein the second channel of the movable member has a plurality of paths symmetrically distributed around the hole.

11. The semiconductor processing device of claim 9, wherein the inlet end of the first channel has a plurality of entrances symmetrically distributed along a circumferential direction of the shaft portion.

12. The semiconductor processing device of claim 9, wherein, when the movable member deforms the elastic member, the concave part of the movable member is closer to an inner side wall of the end portion than the convex part on the inner wall of the gas outlet, and a gap is formed between the concave part and the convex part, thus enabling the inlet end of the second channel to communicate with the uniform-flow chamber.

13. The semiconductor processing device of claim 1, wherein the second gas inlet mechanism comprises a plurality of the gas outlets evenly distributed along a circumferential direction of the uniform-flow chamber.

14. The semiconductor processing device of claim 1, further comprising a first gas inlet mechanism that is disposed at a central position of the top of the reaction chamber.

15. The semiconductor processing device of claim 1, wherein the uniform-flow chamber includes two cover plates, and the uniform-flow chamber is formed by assembling the two cover plates circumferentially arranged at a top of a side wall of the reaction chamber.

16. The semiconductor processing device of claim 15, wherein each of the two cover plates is L-shaped in a half-sectional view along an axial direction of the reaction chamber.

17. The semiconductor processing device of claim 1, further comprising a substrate carrier for carrying a workpiece to be processed in the reaction chamber.

18. A semiconductor processing device comprising: a reaction chamber, a first gas inlet mechanism, and a second gas inlet mechanism that includes a gas inlet, a uniform-flow chamber, and a switch element, wherein:
the first gas inlet mechanism is arranged to deliver a first process gas into the reaction chamber, and the second gas inlet mechanism is arranged to deliver a second process gas from the gas inlet into the reaction chamber through the uniform-flow chamber;
the switch element is disposed between the uniform-flow chamber and the reaction chamber and includes a movable member, wherein:
in response to the second process gas being delivered into the uniform-flow chamber from the gas inlet, a gas pressure applied by the second process gas causes the movable member to move and turn the switch element on to communicate with the uniform-flow chamber with the reaction chamber to bring the second process gas into the reaction chamber, and
in response to no second process gas being delivered into the uniform-flow chamber, the movable member of the switch element remains at an original position to isolate the uniform-flow chamber from the reaction chamber.

* * * * *